United States Patent

Shiobara et al.

[11] Patent Number: 6,027,812
[45] Date of Patent: Feb. 22, 2000

[54] ENCAPSULANT OF CRYSTALLINE EPOXY RESIN AND PHENOLIC RESIN-CRYSTALLINE EPOXY RESIN REACTION PRODUCT

[75] Inventors: Toshio Shiobara; Takayuki Aoki; Shigeki Ino; Eiichi Asano; Satoshi Okuse; Kazutoshi Tomiyoshi, all of Gunma-ken, Japan

[73] Assignee: Shin-Etsu Chemical Co., Ltd., Tokyo, Japan

[21] Appl. No.: 09/006,868

[22] Filed: Jan. 14, 1998

[30] Foreign Application Priority Data

Jan. 24, 1997 [JP] Japan ..................................... 9-026025

[51] Int. Cl.⁷ ............................. B32B 27/38; C08K 3/36; C08L 63/02
[52] U.S. Cl. ........................... 428/413; 523/427; 525/489
[58] Field of Search ............................ 525/489; 523/427; 428/413

[56] References Cited

U.S. PATENT DOCUMENTS 5,623,031  4/1997  Imura et al. ............................ 525/489

FOREIGN PATENT DOCUMENTS

| | | |
|---|---|---|
| 3-47827 | 2/1991 | Japan . |
| 8-27361 | 1/1996 | Japan . |
| 9-176144 | 7/1997 | Japan . |
| 9-176278 | 7/1997 | Japan . |
| 9-266221 | 10/1997 | Japan . |
| 10-1531 | 1/1998 | Japan . |

*Primary Examiner*—Robert E. Sellers
*Attorney, Agent, or Firm*—Birch, Stewart, Kolasch & Birch, LLP

[57] ABSTRACT

An epoxy resin composition comprising a crystalline epoxy resin, a phenolic resin, and an inorganic filler is improved in moldability by previously reacting phenolic hydroxyl groups on the phenolic resin with epoxy groups on the crystalline epoxy resin to form a reaction product and blending the reaction product in the composition. The composition is moldable over semiconductor devices without voids and wire flow. The encapsulated semiconductor devices thus remain reliable.

4 Claims, No Drawings

ENCAPSULANT OF CRYSTALLINE EPOXY RESIN AND PHENOLIC RESIN-CRYSTALLINE EPOXY RESIN REACTION PRODUCT

BACKGROUND OF THE INVENTION

1. Field of the Invention

The present invention relates to an epoxy resin composition having excellent moldability and good adhesion so that it may be moldable over semiconductor devices for encapsulation without voids and other defects. It relates as well to a semiconductor device encapsulated in a cured form of the epoxy resin composition.

2. Prior Art

Biphenyl epoxy resins have come into use recently in a field of molding of semiconductor devices because they improve the solder reflow resistance of epoxy resin compositions. These epoxy resins are also a favorite choice today because their crystallinity and low viscosity allow the high loading of inorganic filler, which in turn ensures minimized moisture absorption, and because they firmly adhere to various types of substrates.

However, biphenyl epoxy resins have some drawbacks. Because of their high crystallinity, they tend to deposit out as crystals when kneading is inadequate. Moreover, molten biphenyl epoxy resins have so low viscosity that little shearing forces would be applied during kneading, resulting in short kneading. As a result, molded parts often have voids at the interior and are thus less reliable. Solutions to these problems have been awaited.

SUMMARY OF THE INVENTION

It is therefore a primary object of the present invention to provide an epoxy resin composition having good moldability enough to overcome the above-described problems in the prior art. It is another object of the invention to provide a semiconductor device encapsulated in a cured form of the epoxy resin composition.

In conjunction with an epoxy resin composition comprising a crystalline epoxy resin such as a biphenyl epoxy resin, a phenolic resin, and an inorganic filler as essential components, we have found that by blending in the composition a reaction product of a crystalline epoxy resin with a phenolic resin, the epoxy resin composition is significantly improved in molding behavior because the reaction product blended is effective for preventing the crystalline epoxy resin from depositing out as crystals during kneading and preventing the composition from extremely lowering its viscosity when melted. Therefore, there is obtained an epoxy resin composition which has good adhesion to various types of substrates as well as excellent moldability. When a semiconductor device is encapsulated in a cured form of this epoxy resin composition, the encapsulated semiconductor device remains highly reliable. Better results are obtained when the reaction product is contained in an amount which corresponds to the reaction of the phenolic hydroxyl groups on a phenolic resin with about 3 to 30% of the epoxy groups on all the crystalline epoxy resin including the unreacted crystalline epoxy resin.

Briefly stated, the present invention provides an epoxy resin composition comprising a crystalline epoxy resin, a phenolic resin, an inorganic filler, and a reaction product obtained by reacting phenolic hydroxyl groups on a phenolic resin with epoxy groups on a crystalline epoxy resin.

In one preferred embodiment, the reaction product is contained in an amount that corresponds to the reaction of the phenolic hydroxyl groups on a phenolic resin with 3 to 30% of the epoxy groups on all the crystalline epoxy resin including the crystalline epoxy resin prior to formation of the reaction product.

Also contemplated herein is a semiconductor device encapsulated in a cured form of the epoxy resin composition.

DETAILED DESCRIPTION OF THE INVENTION

The crystalline epoxy resin used as the main component in the composition of the present invention is preferably an epoxy resin containing at least two epoxy groups in a molecule and having a liquid crystal structure, high crystallinity, and low viscosity. Examples of the epoxy resin include the following structures.

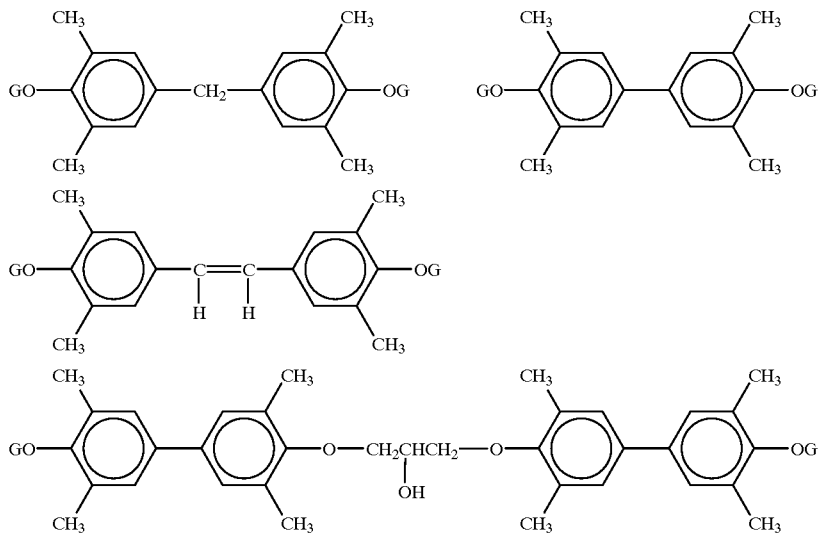

In the formulae, —OG represents

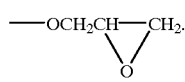

In addition to the above-defined crystalline epoxy resin, another epoxy resin may also be blended in the composition of the invention. Examples of the other epoxy resin that can be used herein include well-known epoxy resins having at least two epoxy groups per molecule, such as bisphenol A-type epoxy resins, bisphenol F-type epoxy resins, phenol novolak-type epoxy resins, cresol novolak-type epoxy resins, naphthalene-type epoxy resins, biphenyl-type epoxy resins, triphenol alkane-type epoxy resins, phenol aralkyl-type epoxy resins and cyclopentadiene-type epoxy resins. These other epoxy resins may be blended in amounts of up to about 30% by weight, especially 0 to about 15% by weight of the overall epoxy resin.

The epoxy resin or resins preferably have a total chlorine content of less than about 1,500 ppm, especially less than about 1,000 ppm. When chlorine is extracted from the epoxy resin with water at 120° C. and an epoxy resin concentration of 50% by weight over a period of 20 hours, the water-extracted chlorine content is preferably less than about 5 ppm. A total chlorine content in excess of about 1,500 ppm or a water-extracted chlorine content of more than about 5 ppm can be detrimental to the moisture-resistant reliability of semiconductors.

The phenolic resin which serves as a curing agent in the composition of the invention may be any phenolic resin having at least two phenolic hydroxyl groups in a molecule. Examples include phenolic novolak resins, cresol novolak resins, phenolic aralkyl resins, naphthalene-type phenolic resins, triphenol alkane-type resins and cyclopentadiene-type phenolic resins. Phenolic hydroxyl group-bearing phenolic resins having the following structures are especially preferable.

In the formulae, n is 0 or an integer from 1 to 5.

These phenolic resins have concentrations of extracted ions such as chloride ions and sodium ions which are preferably each not more than 10 ppm, and more preferably not more than 5 ppm.

The mixing ratio of the crystalline epoxy resin and the phenolic resin curing agent is preferably such that about 0.5 to 1.6 moles, especially about 0.6 to 1.4 moles of phenolic hydroxyl groups are available per mole of epoxy groups. When the mixing ratio of the epoxy resin and the phenolic resin is less than 0.5 mole of phenolic hydroxyl groups, as defined herein, the homopolymerization of epoxy groups becomes predominant due to a shortage of available hydroxyl groups, which can result in a low glass transition temperature. On the other hand, when the mixing ratio exceeds about 1.6 moles of phenolic hydroxyl groups, a higher proportion of phenolic hydroxyl groups would suppress reactivity, sometimes resulting in a lower crosslinking density and insufficient strength.

In addition to the crystalline epoxy resin and the phenolic resin curing agent, the epoxy resin composition of the invention also contains as a resin component a preliminary reaction product between a crystalline epoxy resin and a phenol resin. The reaction product forms by the reaction of epoxy groups on the crystalline epoxy resin with phenolic hydroxyl groups on the phenolic resin. This reaction product is a critical component for improving the moldability of the inventive composition.

The preliminary reaction product between a crystalline epoxy resin and a phenolic resin can be obtained by previously reacting predetermined amounts of the crystalline epoxy resin and the phenolic resin in the presence of an optional catalyst and in a solvent or in bulk.

Alternatively, the preliminary reaction product may be obtained by placing the crystalline epoxy resin and the phenolic resin in a kneading apparatus such as a kneader, and adding a catalyst thereto, and kneading the resins. Then the resins react with each other during kneading. In some cases, the reaction product may be prepared without resort-

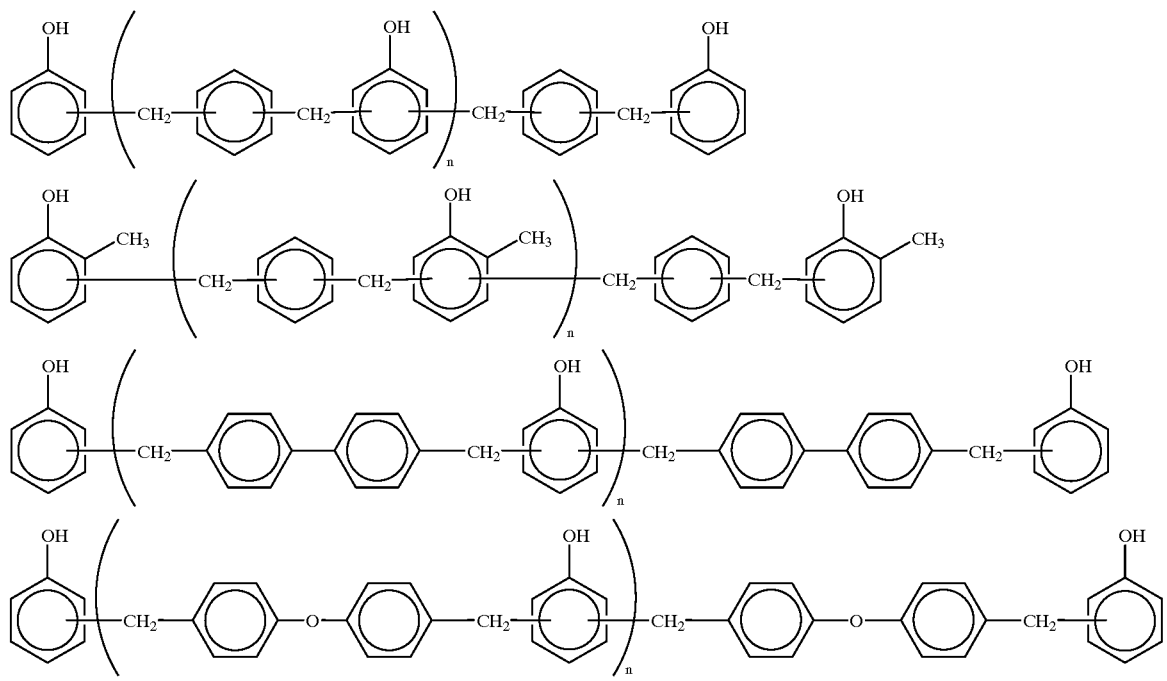

ing to catalysts, that is, by thoroughly kneading the starting resins at an elevated temperature to induce the reaction.

At the time of this reaction, the crystalline epoxy resin and the phenolic resin are preferably blended in such a ratio that about 50 to 200 parts by weight, especially about 100 to 200 parts by weight of the phenolic resin is available per 100 parts by weight of the crystalline epoxy resin. When the proportion of phenolic resin is less than about 50 parts by weight, the number of epoxy groups becomes too large, which gives rise to polymerization between epoxy groups at the time of the reaction and can in turn result in a higher viscosity for the reaction product as well as for the composition in which it is blended. On the other hand, when the proportion of phenolic resin exceeds about 200 parts by weight, the likelihood of epoxy groups remaining in the reaction product decreases and product bearing only hydroxyl groups may be obtained, necessitating the further addition of epoxy resin.

Examples of the catalyst that can be used to obtain the preliminary reaction product include phosphorus catalysts, imidazole derivatives and cycloamidine derivatives. Of these, phosphorus catalysts are preferable, with triphenylphosphine being especially preferable on account of its ability to prevent side reactions. The catalyst is preferably blended in an amount of about 0.01 to 10 parts by weight per 100 parts by weight of the combined amount of the crystalline epoxy resin and the phenolic resin used to obtain the preliminary reaction product.

When a solvent is employed in the above reaction, it is desirable to use a ketone solvent such as methyl isobutyl ketone or an aromatic solvent such as toluene. The amount of solvent used is preferably less than about 500 parts by weight, and more preferably about 50 to 400 parts by weight, per 100 parts by weight of the combined amount of crystalline epoxy resin and phenolic resin used to obtain the preliminary reaction product.

With respect to the conditions of reaction between a crystalline epoxy resin and a phenolic resin, the reaction temperature is preferably about 50 to 120° C., and more preferably 50 to 100° C. The reaction time varies with the reaction temperature, although a reaction time of about 5 to 30 minutes is preferable, and a reaction time of about 10 to 20 minutes is even more preferable. When the reaction is carried out in a solvent or in bulk, strict control of the reaction temperature and time is desirable in order to prevent gelling. Following reaction completion, it is advisable to promptly remove and cool the reaction product.

The reaction product between a crystalline epoxy resin and a phenolic resin obtained in this reaction can be illustrated as follows by an example in which a biphenyl epoxy resin serves as the crystalline epoxy resin and a phenolic aralkyl resin serves as the phenolic resin. The termination of reaction at an early stage, changes in the epoxy equivalent following the reaction, and other observations suggest that this reaction apparently results in the formation of, for example, A-B, A-B-A and B-A-B type compounds (where A represents the epoxy resin and B represents the phenolic resin) having the structures indicated below, in which either epoxy groups or phenolic hydroxyl groups, and preferably both epoxy groups and phenolic hydroxyl groups, remain on the molecule.

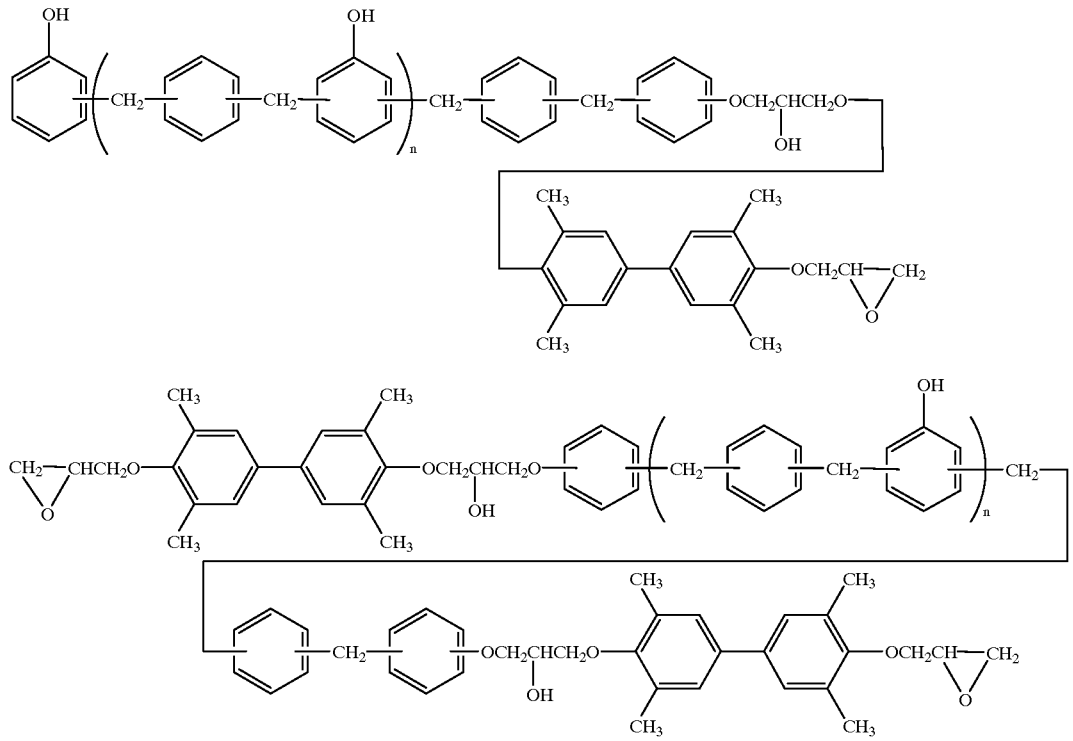

-continued

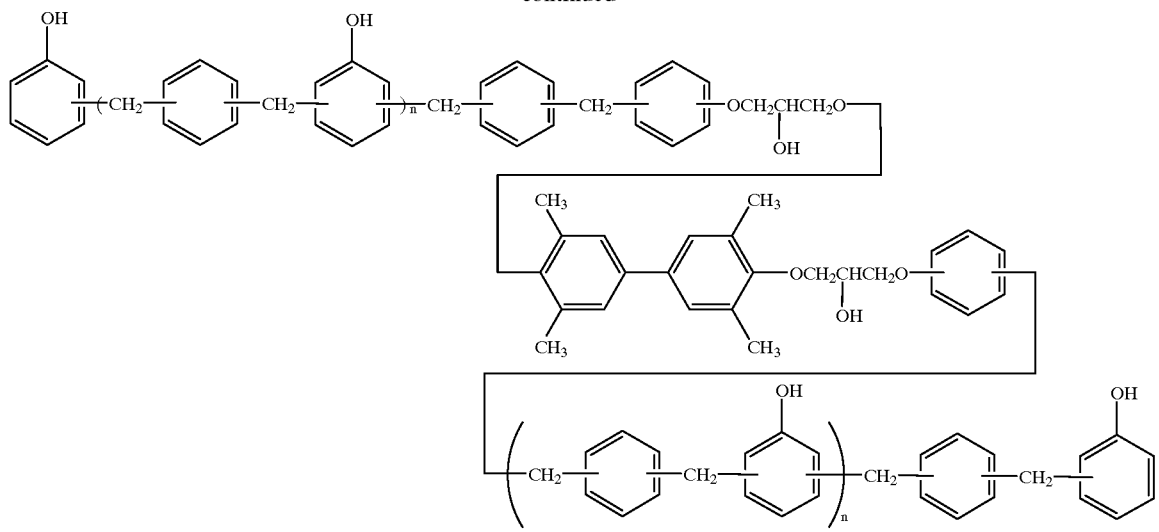

Letter n is 0 or an integer from 1 to 5.

The reaction product is preferably blended in an amount which corresponds to the reaction by the phenolic hydroxyl groups on the phenolic resin with about 3 to 30% (either weight basis or molar basis), and especially about 5 to 25%, of all the epoxy groups on all the crystalline epoxy resin used in preparing the epoxy resin composition of the invention. The phrase "all the crystalline epoxy resin" as used herein refers collectively to the crystalline epoxy resin serving as the preliminary reaction product-yielding material prior to the formation of the reaction product and the crystalline epoxy resin serving as the above-described main component of the epoxy resin composition. It is therefore preferable to control the amount of phenolic resin and the amount of crystalline epoxy resin reacting therewith, and also to control the reaction, in such a manner as to yield the above-indicated amount of reaction product. When the amount of preliminary reaction product corresponds to the reaction of the phenolic hydroxyl groups with less than about 3% of all the epoxy groups, the crystalline epoxy resin tends to crystallize and deposit out after kneading, which can result in a decline in the uniformity and moldability of the resin. On the other hand, when the amount of reaction product as expressed above exceeds about 30%, the viscosity becomes high, discouraging higher loadings of inorganic fillers. This can have the effect of exacerbating the stress properties, moisture absorption, and solder reflow resistance of the epoxy resin composition.

A method which may be employed for adjusting the proportion of reacted epoxy groups in the crystalline epoxy resin to within the specific range involves first blending predetermined amounts of a crystalline epoxy resin and a phenolic resin, then terminating the reaction at a relatively early stage at which the proportion of reacted epoxy groups reaches the specific range.

However, if the proportion of reacted epoxy groups in the crystalline epoxy resin exceeds 30% in the preliminary reaction product that has been obtained, further crystalline epoxy resin may be optionally added in an appropriate amount to the mixture composed of crystalline epoxy resin, phenolic resin and the preliminary reaction product so that the blended amount of preliminary reaction product is adjusted to the level corresponding to the reaction of about 3 to 30% of the epoxy groups in all the crystalline epoxy resin with the phenolic hydroxyl groups in the phenolic resin.

The inorganic filler used in the composition of the present invention may be selected from among fillers which are blended in conventional epoxy resin compositions, such as fused silica which has been ground in a ball mill, for instance, spherical silica obtained by flame fusion, spherical silica produced by a sol-gel process, crystalline silica, alumina, boron nitride, aluminum nitride, silicon nitride, magnesia and magnesium silicate. If the semiconductor device generates a lot of heat, fillers having the highest possible thermal conductivity and a low coefficient of thermal expansion, such as aluminum, boron nitride, aluminum nitride and silicon nitride, are preferred. These fillers may also be used as a blend with fused silica or the like.

Epoxy resin compositions having a melt viscosity at 175° C. of less than about 200 poises, and especially less than about 100 poises, are appropriate for encapsulating microelectronic devices. To this end, the inorganic filler is preferably spherical and has a particle size distribution which allows the closest possible packing. It is also desirable for the inorganic filler have a particle size distribution such that the average particle size (as a weight average based on the laser diffraction technique, for example) is about 4 to 30 μm, with a maximum particle size preferably not more than 74 μm, and more preferably not more than 50 μm, as well as a specific surface area of not more than 3.0 m$^2$/g, preferably 0.8 to 2.5 m$^2$/g, more preferably 1.0 to 2.0 m$^2$/g.

The amount of inorganic filler used is preferably about 550 to 1,000 parts by weight, and more preferably about 750 to 950 parts by weight, per 100 parts by weight of the combined amount of the preliminary reaction product, crystalline epoxy resin and phenolic resin. A composition with less than about 550 parts by weight of inorganic filler would have an inadequately reduced coefficient of thermal expansion and increased moisture absorption, and cracks sometimes form in the package at the solder reflow temperature. On the other hand, the use of more than about 1,000 parts by weight may make the composition so viscous as to obstruct molding.

It is also desirable to blend a curing accelerator in the inventive composition. Examples of the curing accelerator used herein include phosphorus compounds, imidazole derivatives and cycloamidine derivatives. The curing accelerator is preferably blended in an amount of about 0.01 to 10 parts by weight per 100 parts by weight of the combined amount of the reaction product, epoxy resin and phenolic resin.

Other ingredients may be added to the inventive composition, if necessary. Examples of such optional ingredients include brominated epoxy resins and antimony oxide derivatives for the purpose of flame retardance, and well-known diluents for lowering viscosity, such as n-butyl glycidyl ether, phenyl glycidyl ether, styrene oxide, t-butylphenyl glycidyl ether, dicyclopentadiene diepoxide, phenol, cresol and t-butylphenol.

Coupling agents such as silane coupling agents, titanium coupling agents and aluminum coupling agents, colorants such as carbon black, wetting enhancers such as nonionic surfactants, fluorinated surfactants and silicone oils, antifoaming agents and other ingredients may also be added as needed. These optional ingredients may be added in conventional amounts insofar as the advantages of the invention are not impaired.

The resin composition of the invention may be prepared by uniformly mixing the above starting materials in a high-speed mixer or other apparatus and thoroughly kneading with a two-roll mill or a continuous kneading apparatus, for instance. When a mixture of the crystalline epoxy resin, the phenolic resin and the preliminary reaction product is obtained, it is preferable to prepare from the first a mixture which contains the preliminary reaction product in the above-indicated amount without a need for adjustment by the subsequent addition of crystalline epoxy resin. The mixture is then blended and kneaded with the inorganic filler and other optional ingredients. This procedure ensures that the preliminary reaction product contains in a higher ratio those constituents having both epoxy groups and phenolic hydroxyl groups on one molecule, leading to the manufacture of an epoxy resin composition having an even better moldability. The kneading temperature is preferably about 50 to 110° C., and the kneading time is preferably about 3 to 10 minutes.

After kneading, the epoxy resin composition can be further processed by forming it into a thin sheet, cooling and comminuting. The epoxy resin composition of the invention can then be used as general-purpose molding resins, although it is particularly suitable for use as an encapsulant for semiconductor devices such as thin packages. In the latter case, the encapsulation of semiconductor devices may be carried out by known molding processes such as transfer molding, preferably under molding conditions of about 165 to 185° C. and about 1 to 3 minutes.

EXAMPLE

Examples of the invention are given below by way of illustration and not by way of limitation. All parts are by weight.

Synthesis Example 1

Amounts of 46.5 parts of a biphenyl epoxy resin YX4000HK (manufactured by Yuka Shell K.K.), 53.6 parts of a phenol aralkyl resin Mylex 225-3L (manufactured by Mitsui Toatsu K.K.) as the curing agent, and 0.2 part of triphenylphosphine were weighed out and placed in a kneader, then kneaded at 70° C. for 15 minutes. After kneading, the reacted resin was formed into a thin sheet and cooled whereupon it was measured for epoxy equivalent. The epoxy equivalent increased to 415 from the value of 386 prior to the reaction, indicating that the mixture contained the reaction product from the reaction of about 7% of the epoxy groups in the initial biphenyl epoxy resin with phenolic hydroxyl groups in the phenolic aralkyl resin. This mixture is designated reaction product-containing mixture (1).

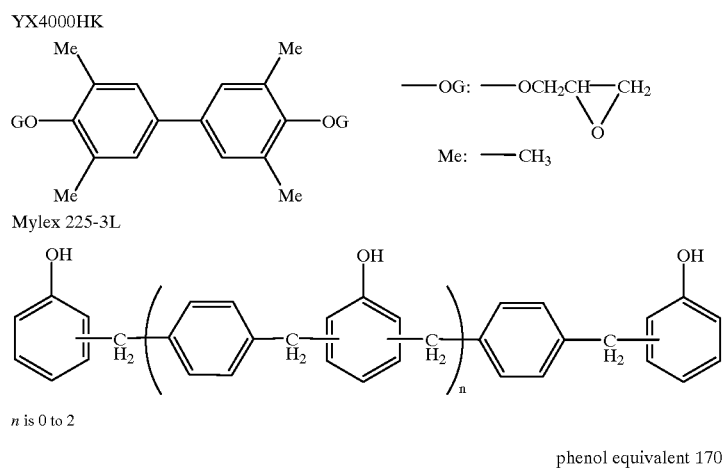

Synthesis Example 2

The same starting materials as in Synthesis Example 1 were weighed out and reacted in a kneader at 70° C. for 30 minutes, yielding a molten mixture having an epoxy equivalent of 515. Based on the epoxy equivalent, this mixture was confirmed to contain the reaction product from the reaction of about 25% of the epoxy groups in the initial biphenyl epoxy resin with phenolic hydroxyl groups in the phenolic aralkyl resin. This is reaction product-containing mixture (2).

Synthesis Example 3

The same blend as in Synthesis Example 1 was reacted for 3 minutes, yielding a molten mixture having an epoxy equivalent of 342. Based on the epoxy equivalent, this mixture was confirmed to contain the reaction product from the reaction of less than 1% of the epoxy groups in the initial biphenyl epoxy resin with phenolic hydroxyl groups in the phenolic aralkyl resin. This is reaction product-containing mixture (3).

Synthesis Example 4

The same blend as in Synthesis Example 1 was reacted for 40 minutes, yielding a molten mixture having an epoxy equivalent of 594. Based on the epoxy equivalent, this mixture was confirmed to contain the reaction product from the reaction of 35% of the epoxy groups in the initial biphenyl epoxy resin with phenolic hydroxyl groups in the phenolic aralkyl resin. This is reaction product-containing mixture (4).

Synthesis Example 5

The epoxy resin and phenolic resin shown below were reacted under exactly the same conditions as in Synthesis Example 1 to give a reaction mixture. From the epoxy equivalent, this mixture was confirmed to contain the reaction product from the reaction of 18% of the epoxy groups in the initial epoxy resin with phenolic hydroxyl groups in the phenolic aralkyl resin. This is reaction product-containing mixture (5).

| Components | Amounts |
|---|---|
| Epoxy resin: | |
| [structure: GO—C6H2(CH3)2—CH=CH—C6H2(CH3)2—OG] | 57.1 parts |
| Curing agent: | |
| Mylex 225-3L (Mitsui Toatsu K.K.) | 42.9 parts |
| Conversion: 18% | |

Examples 1–3, Comparative Examples 1–3

The reaction product-containing mixtures (resin compositions) obtained in Synthesis Examples 1 to 5 were finely ground before use. The ingredients shown in Table 1 were weighed out, then mixed with the respective reaction product-containing mixtures in a high-speed mixer. The resulting mixtures were uniformly melt-kneaded in a continuous kneader, then cooled and comminuted, thereby giving five epoxy resin compositions. For comparison purpose, 46.5 parts of the same biphenyl epoxy resin and 53.6 parts of the same curing agent as in Synthesis Example 1 were weighed out and mixed, then used directly as the resin ingredients, without a preliminary reaction, to give an epoxy resin composition of Comparative Example 1.

These epoxy resin compositions were subjected to the following tests. The results are shown in Table 1.

(a) Spiral Flow:

Measured by using a mold in accordance with EMMI standards and molding at 175° C. and 70 kg/cm² for 120 seconds.

(b) Moldability:

In order to examine the moldability, each of the compositions prepared above was molded over ten QFP packages (14×20×2.7 mm) with aluminum dummy devices mounted thereon, under conditions of 175° C. and 70 kg/cm². All packages with molding defects such as external voids, internal voids or short filling were regarded as defective. The packages were also observed for gold wire flow to examine wire deformation.

TABLE 1

| Composition (pbw) | Examples | | | Comparative Examples | | |
|---|---|---|---|---|---|---|
| | 1 | 2 | 3 | 1 | 2 | 3 |
| Reaction product-containing mixture | (1) | (2) | (5) | — | (3) | (4) |
| Combined amount of resin ingredients | 100 | 100 | 100 | 100 | 100 | 100 |
| Fused silica | 800 | 800 | 800 | 800 | 800 | 800 |
| Carbon black | 1.5 | 1.5 | 1.5 | 1.5 | 1.5 | 1.5 |

TABLE 1-continued

| Composition (pbw) | Examples | | | Comparative Examples | | |
|---|---|---|---|---|---|---|
| | 1 | 2 | 3 | 1 | 2 | 3 |
| Silane coupling agent*[1] | 1.5 | 1.5 | 1.5 | 1.5 | 1.5 | 1.5 |
| Carnauba wax | 1.5 | 1.5 | 1.5 | 1.5 | 1.5 | 1.5 |
| Triphenylphosphine | 1.0 | 1.0 | 1.0 | 1.0 | 1.0 | 1.0 |
| Spiral flow (cm) | 115 | 98 | 108 | 128 | 120 | 38 |
| Packages with voids | 0/10 | 0/10 | 0/10 | 8/10 | 5/10 | 0/10 |
| Gold wire flow | no | no | no | yes | yes | yes |

*[1]KBM403 γ-glycidoxypropyltrimethoxysilane, Shin-Etsu Chemical Industry Co., Ltd.

The results in Table 1 demonstrate that the epoxy resin compositions according to the present invention (Examples 1 to 3) are readily moldable and cure into products having good adhesion and reliability.

There has been described an epoxy resin composition having excellent moldability and adhesion. It can be molded without defects such as voids and gold wire flow. Semiconductor devices encapsulated with cured products of the epoxy resin composition have high reliability.

Japanese Patent Application No. 26025/1997 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

We claim:

1. An epoxy resin composition comprising a crystalline epoxy resin, a phenolic resin, from about 550 to 1,000 parts by weight per 100 parts by weight of the combined amount of crystalline epoxy resin, phenolic resin and reaction product, of an inorganic filler, and a reaction product obtained by reacting phenolic hydroxyl groups on a phenolic resin with from 3 to 30% of the epoxy groups on a crystalline epoxy resin including the crystalline epoxy resin prior to formation of said reaction product.

2. The epoxy resin composition of claim 1 wherein the crystalline epoxy resin is at least one of the following formulae:

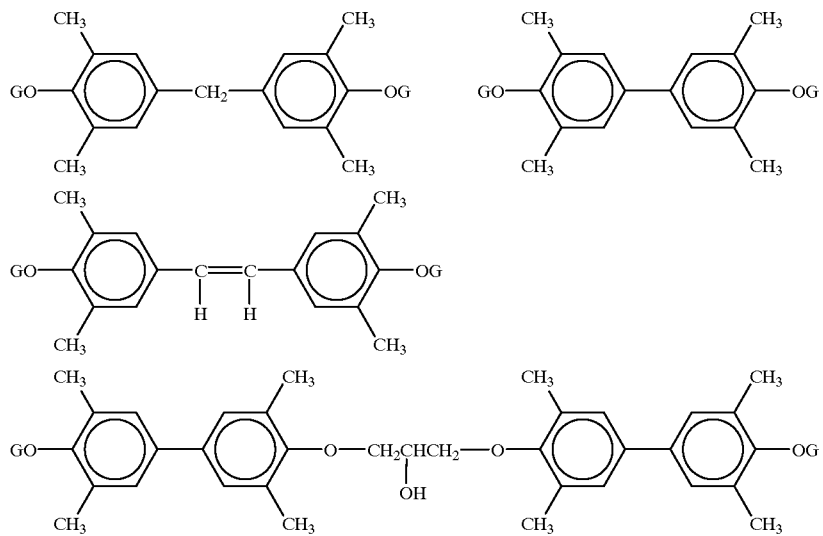
wherein —OG represents
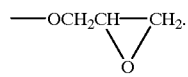
3. A semiconductor device encapsulated in a cured form of the epoxy resin composition of claim 1.
4. An encapsulant for a semiconductor device consisting of the epoxy resin composition of claim 1.
* * * * *